(12) United States Patent
Yamao et al.

(10) Patent No.: US 8,973,888 B2
(45) Date of Patent: Mar. 10, 2015

(54) POLYCRYSTALLINE SILICON INGOT CASTING MOLD AND METHOD FOR PRODUCING SAME, AND SILICON NITRIDE POWDER FOR MOLD RELEASE MATERIAL FOR POLYCRYSTALLINE SILICON INGOT CASTING MOLD AND SLURRY CONTAINING SAME

(71) Applicant: Ube Industries, Ltd., Ube-shi (JP)

(72) Inventors: Takeshi Yamao, Ube (JP); Takayuki Fujii, Ube (JP); Shinsuke Jida, Ube (JP)

(73) Assignee: Ube Industries, Ltd., Ube-shi (JP)

( * ) Notice: Subject to any disclaimer, the term of this patent is extended or adjusted under 35 U.S.C. 154(b) by 35 days.

(21) Appl. No.: 13/927,716

(22) Filed: Jun. 26, 2013

(65) Prior Publication Data

US 2014/0158858 A1 Jun. 12, 2014

Related U.S. Application Data

(63) Continuation of application No. PCT/JP2011/067108, filed on Jul. 27, 2011.

(30) Foreign Application Priority Data

Dec. 28, 2010 (JP) ................................. 2010-293061

(51) Int. Cl.
```
B29C 33/38      (2006.01)
C01B 21/068     (2006.01)
B29C 33/60      (2006.01)
C01B 33/02      (2006.01)
C30B 11/00      (2006.01)
C30B 29/06      (2006.01)
```

(52) U.S. Cl.
CPC ............... B29C 33/60 (2013.01); C01B 21/068 (2013.01); C01B 33/02 (2013.01); C01P 2004/03 (2013.01); C01P 2004/61 (2013.01); C01P 2004/62 (2013.01); C30B 11/002 (2013.01); C30B 29/06 (2013.01); C01B 21/0687 (2013.01); C01P 2006/22 (2013.01); C01P 2006/80 (2013.01); B29C 33/38 (2013.01)
USPC ..................... 249/115; 106/38.27; 249/114.1; 427/133; 428/402

(58) Field of Classification Search
CPC .. C01B 21/068; C01B 21/0687; C01B 33/02; B29C 33/38; B29C 33/60; C30B 29/06; C01P 2004/61; C01P 2004/62
USPC ............. 106/38.27; 249/114.1, 115; 427/133; 428/402
See application file for complete search history.

(56) References Cited

U.S. PATENT DOCUMENTS

| | | | | | |
|---|---|---|---|---|---|
| 5,001,091 | A | * | 3/1991 | Pujari et al. | 501/103 |
| 5,047,186 | A | * | 9/1991 | Huckabee et al. | 264/641 |
| 5,571,760 | A | * | 11/1996 | Pujari et al. | 501/97.2 |
| 5,759,481 | A | * | 6/1998 | Pujari et al. | 264/655 |
| 2002/0164475 | A1 | * | 11/2002 | Imamura et al. | 428/325 |
| 2009/0119882 | A1 | | 5/2009 | Uibel | |

FOREIGN PATENT DOCUMENTS

| | | | |
|---|---|---|---|
| EP | 2116637 A2 | 11/2009 | |
| JP | 3290370 A | 12/1991 | |
| JP | 09-175809 | * 7/1997 | ............ C01B 33/02 |
| JP | 10-316469 | * 12/1998 | ............ C04B 35/58 |
| JP | 2907366 B2 | 4/1999 | |
| JP | 2907367 B2 | 4/1999 | |
| JP | 2001198648 A | 7/2001 | |
| JP | 2001510434 A | 7/2001 | |
| JP | 3282456 B2 | 3/2002 | |
| JP | 200297005 A | 4/2002 | |
| JP | 2004-091243 A | * 3/2004 | |
| JP | 2004-202813 A | * 7/2004 | |
| JP | 2004-262756 A | * 9/2004 | |
| JP | 2004291029 A | 10/2004 | |
| JP | 200595924 A | 4/2005 | |
| JP | 2007261832 A | 10/2007 | |
| WO | 2007039310 A1 | 4/2007 | |
| WO | 2008026688 A1 | 3/2008 | |

OTHER PUBLICATIONS

Translation of JP 09-175809. (Date is not applicable).*
Peuckert et al, "Oxygen distribution in silicon nitride powders", Journal of Materials Science, 1987, vol. 22, pp. 3717-3720, XP-001188503.
Leipold et al., "Materials of Construction for Silicon Crystal Growth", Journal of Crystal Growth, 1980, vol. 50, pp. 366-375, North-Holland Publishing Company.
Shao et al., "Novel Method for Fabrication of Silicon Nitride/Silicon Oxynitride Composite Ceramic Foams Using Fly Ash Cenosphere as a Pore-Forming Agent", Journal of the American Ceramic Society, 2008, vol. 91, No. 11, pp. 3781-3785.
Li et al., "Influence of Oxygen Partial Pressure on the Wetting Behaviour of Silicon Nitride by Molten Silicon", Journal of the European Ceramic Society, 1992, vol. 9, pp. 101-105.

* cited by examiner

*Primary Examiner* — Anthony J Green
(74) *Attorney, Agent, or Firm* — The Webb Law Firm (57) ABSTRACT

Provided are a polycrystalline silicon ingot casting mold and a method for producing a polycrystalline silicon ingot casting mold, with which high-quality silicon ingots can be obtained at high yields by minimizing sticking with the surfaces of the silicon ingot casting mold, and losses and damages that occur when solidified silicon ingot is released from the mold. The method for producing a polycrystalline silicon ingot casting mold having a release layer, including: forming a slurry by mixing a silicon nitride powder with water, coating the surface of the mold with the slurry, and heating the mold at 400 to 800° C. in an atmosphere containing oxygen, after coating the slurry.

5 Claims, 2 Drawing Sheets

POLYCRYSTALLINE SILICON INGOT CASTING MOLD AND METHOD FOR PRODUCING SAME, AND SILICON NITRIDE POWDER FOR MOLD RELEASE MATERIAL FOR POLYCRYSTALLINE SILICON INGOT CASTING MOLD AND SLURRY CONTAINING SAME

CROSS REFERENCE TO RELATED APPLICATIONS

This application is a continuation application of PCT application No. PCT/JP2011/067108, filed on Jul. 27, 2011, which is based on and claims the benefit of priority from prior Japanese Patent Application No. 2010-293061, filed on Dec. 28, 2010, the entire contents of which are incorporated herein by reference.

BACKGROUND OF THE INVENTION

1. Field of the Invention

The present invention relates to a polycrystalline silicon ingot casting mold and a method for producing the same, silicon nitride powder for mold release material for a polycrystalline silicon ingot casting mold and a slurry containing the same.

2. Description of the Related Art

As one type of semiconductor substrate for producing a solar cell, polycrystalline silicon is widely used and its production amount rapidly increases every year. Polycrystalline silicon is generally formed either by filling silicon melt, which is melt by heating at high temperature, in a mold formed of a quartz crucible, a dividable graphite crucible, or a quartz crucible installed inside a graphite crucible, the inner surface of which is coated with a mold release material by spray or by using a brush or a spatula, followed by solidification, or by melting first a silicon material added in the mold followed by re-solidification.

The release layer prevents incorporation of impurities to a silicon ingot and adhesion of heat-melted silicon melt onto an inner surface of a crucible as a mold, and thus plays an important role of releasing a solidified silicon ingot from a mold. As for the mold release material, from the viewpoint of having generally high melting point and little contamination for silicon ingot, high purity powder such as silicon nitride, silicon carbide, and silicon oxide, or their mixture powder is used. For increasing productivity of silicon ingot, many researches and studies have been made regarding a method of forming a mold release material layer on a mold surface, a mold obtained by such treatment, or a method for producing a silicon ingot by using such mold.

For example, Patent Literature 1 discloses a release layer of a mold for casting a silicon ingot which is formed of silicon nitride powder obtained by thermal decomposition of silicon diimide and fine silica powder as a mold release material and includes a first layer located on an inner side (i.e., mold side) of the release layer and having which has high ratio of silicon nitride containing non-crystalline silica layer on surface of silicon nitride particles, and a second layer located on an outer side (i.e., silicon ingot side) of the release layer and containing fine silica powder mixed therewith so that powder particles are strongly bound to each other. It is also disclosed that, due to the presence of the release layer, damages occurring on a solidified silicon ingot and a mold can be reduced during release. In addition, it is disclosed in Patent Literature 2 that, by using a release layer based on a mixture in which coarse melt silica sands are coated with silicon nitride powder, reaction between molten silicon and silica is inhibited so that the performance of a battery for solar power generation can be enhanced.

[Patent Document 1] JP 2005-95924 A
[Patent Document 2] JP 2001-198648 A

SUMMARY OF THE INVENTION

Meanwhile, with regard to the mold for silicon casting described in Patent Literature 1, the second layer containing fine silica powder mixed therewith so that powder particles are strongly bound to each other (i.e., a layer on outer side of a release layer) has high oxygen content, and there is a high risk of having sticking onto a mold surface as a result of forming a solid solution with silicon melt. Further, since the method for forming a release layer disclosed in Patent Literature 1 requires preparation of a slurry of mold release material with difference silica concentration and there is almost no difference in color of each slurry, an incorrect coating order may be employed by mistake.

Further, the method of forming a release layer of Patent Literature 2 is problematic in that, since it is difficult to have coarse melt silica sands covered with a release layer, melt silica sands are dispersed on outer surface of the release layer, and as a result of forming a solid solution with silicon melt, sticking on a mold surface is caused and losses occur when releasing a solidified silicon ingot, yielding lower yield.

Meanwhile, since the mold release material disclosed in Patent Literature 1 and Patent Literature 2 has high alkali metal or alkali earth metal impurities in silica powder to be added, it is necessary to prepare high purity powder. However, as described above, with regard to the release layer to be formed in a polycrystalline silicon ingot casting mold, it enhances the adhesiveness between a release layer and a mold and also the binding property among silicon nitride particles in a release layer, and thus addition of silica is believed to be effective. However, the release layer containing silicon melt and silica adheres onto a mold by solid solution reaction and becomes the cause of losses or damages that occur when a solidified silicon ingot is released, and thus there is a problem that it is difficult to produce a high quality silicon ingot with high yield.

The present invention is completed in view of the problems of prior art as described above, and it is an object of the present invention to provide a polycrystalline silicon ingot casting mold and a method for producing the polycrystalline silicon ingot casting mold, with which a high-quality silicon ingot can be obtained at high yield by suppressing sticking of the casting mold surfaces and the silicon ingot, or losses and damages that occur when the solidified silicon ingot is released from the mold, and also to provide a silicon nitride powder for mold release material for a polycrystalline silicon ingot casting mold and a slurry containing it.

Inventors of the present invention conducted intensive studies to solve the problems described above, and as a result found that, by using a silicon nitride powder, to which other particles having different oxygen content and different particle diameter are added, as a raw material of a mold release material, baking temperature for enhancing adhesiveness of a release layer can be suppressed at low level and a resulting casting mold provided with a release layer having no crack or peeling caused by shrinking is excellent as a casting mold for producing a silicon ingot. The present invention is completed accordingly. Specifically, according to the present invention, there is provided a method for producing a polycrystalline silicon ingot casting mold having a release layer, which includes forming a slurry by mixing a silicon nitride powder with water, the silicon nitride powder being obtained by blending a silicon nitride powder (A) having an average particle diameter along the short axis of 0.6 to 13 μm and an oxygen content of 0.3 to 1.0% by weight with a silicon nitride powder (B) having an average particle diameter along the short axis of 0.1 to 0.3 μm and an oxygen content of 1.3 to 20% by weight at a weight ratio of 5:5 to 9:1, coating the surface of the mold with the slurry, and heating the mold at 400 to 800° C. in an atmosphere containing oxygen, after the coating of the slurry.

Further, according to the present invention, there is provided a silicon nitride powder for mold release material for a polycrystalline silicon ingot casting mold, which contains a silicon nitride powder (A) having an average particle diameter along the short axis of 0.6 to 13 μm and an oxygen content of 0.3 to 1.0% by weight and a silicon nitride powder (B) having an average particle diameter along the short axis of 0.1 to 0.3 μm and an oxygen content of 1.3 to 20% by weight at a weight ratio of 5:5 to 9:1. Still further, according to the present invention, there is provided a slurry containing the silicon nitride powder for mold release material for a polycrystalline silicon ingot casting mold, in which the silicon nitride powder is mixed with water, and a polycrystalline silicon ingot casting mold, in which a release layer is formed on an inner surface of a mold by using the silicon nitride powder.

As described above, according to the present invention, there can be provided a polycrystalline silicon ingot casting mold which enables obtainment of a high-quality silicon ingot at high yield by suppressing an occurrence of cracks or peeling caused by shrinking of a release layer during baking step and suppressing an occurrence of losses or damages when a solidified silicon ingot is released and a method for producing the polycrystalline silicon ingot casting mold, silicon nitride powder for mold release material for a polycrystalline silicon ingot casting mold, and a slurry containing it.

DETAILED DESCRIPTION OF THE EMBODIMENTS

Figure 1:
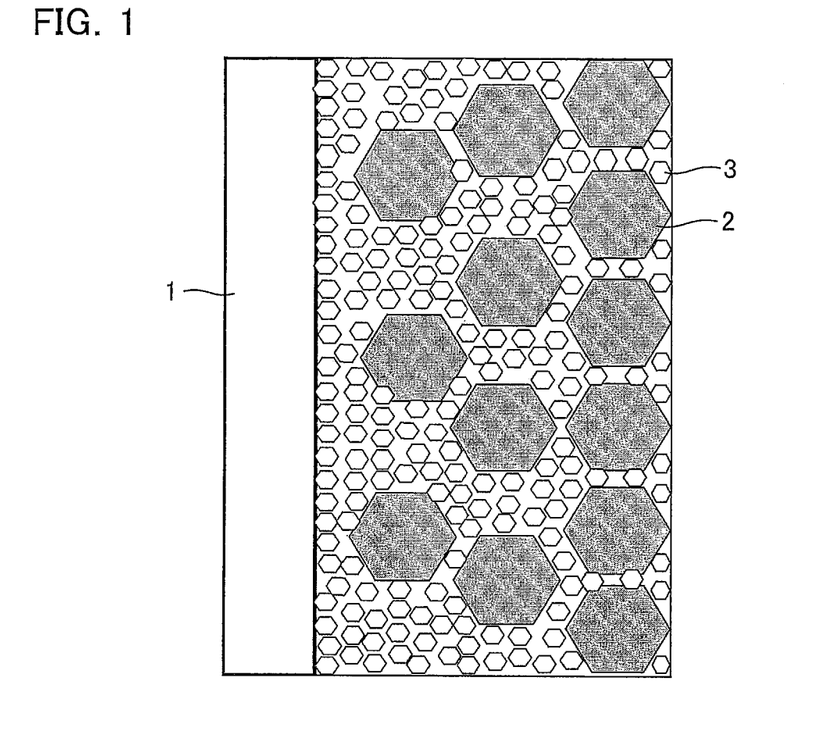
FIG. 1 is a conceptual diagram illustrating a state in which particles are localized in a release layer according to the present invention.

In the method for producing a polycrystalline silicon ingot casting mold having a release layer according to the present invention, by coating an inner side of a mold with a slurry containing silicon nitride powder obtained by mixing silicon nitride powder with water, the silicon nitride powder being obtained by blending a silicon nitride powder (A) having an average particle diameter along the short axis of 0.6 to 13 μm and an oxygen content of 0.3 to 1.0% by weight with a silicon nitride powder (B) having an average particle diameter along the short axis of 0.1 to 0.3 μm and an oxygen content of 1.3 to 20% by weight at a weight ratio of 5:5 to 9:1, at the time of absorption by capillary force of a mold, fine particles are attracted more to the mold near mold surface based on a difference in movement rate according to particle size, and thus fine particles are localized on an inner side (i.e., mold side) of a release layer while they are present in a lower amount on an outer side of a release layer (i.e., silicon ingot side). As a result, a release layer containing localized coarse particles is formed. Consequently, as illustrated in FIG. 1, a layer in which fine particles with high oxygen content is localized on a mold side of a release layer and coarse particles with low oxygen content is localized on a silicon ingot side can be formed. Further, it becomes possible to deal with shrinkage stress during drying with adhesiveness of fine particles with high oxygen content on a mold side to perform a baking treatment at low temperatures of 400 to 800° C. for increasing the adhesiveness of a release layer. It is also possible to lower shrinkage stress during baking and form conveniently a release layer at low cost without having a phenomenon of cracks or peelings. It is also possible to obtain high density as and high purity, excellent adhesion strength between powders constituting the release layer and excellent adhesion with the mold, and also to prevent permeation of a melt caused by cracks or damages of the release layer.

According to the method for producing a polycrystalline silicon ingot casting mold having a release layer according to the present invention, a mold with a release layer formed at low cost can be produced, the obtained mold has a release layer which contains little amount of metal impurities and has high density so that excellent adhesiveness is obtained between the release layer and the mold, and since permeation of a silicon melt caused by cracks or damages of the release layer is prevented, solid solution reaction between the silicon melt and the release layer is suppressed, and also by having greatly improved releasability of a solidified silicon ingot from the mold, an occurrence of losses or damages at the time of releasing the solidified silicon ingot is suppressed, and thus a high-quality silicon ingot can be obtained at high yield.

With regard to the method for producing a polycrystalline silicon ingot casting mold having a release layer according to the present invention, the forming of the slurry is a step for forming a slurry by mixing a silicon nitride powder with water, the silicon nitride powder being obtained by blending a silicon nitride powder (A) having an average particle diameter along the short axis of 0.6 to 13 μm and an oxygen content of 0.3 to 1.0% by weight with a silicon nitride powder (B) having an average particle diameter along the short axis of 0.1 to 0.3 μm and an oxygen content of 1.3 to 20% by weight at a weight ratio of 5:5 to 9:1.

Figure 2:
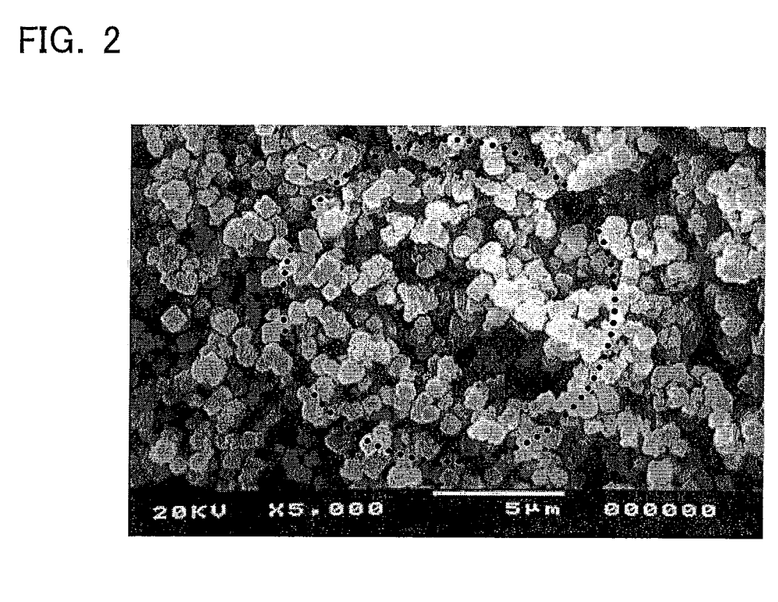
FIG. 2 is a SEM photograph (×5000 magnification) for measuring particle diameter along the short axis.

As described herein, the "average particle diameter along the short axis" indicates an average particle diameter along the short axis that is determined by size measurement of a SEM image. The average particle diameter along the short axis that is determined by size measurement of a SEM image is obtained by drawing a circle to contact 50 to 200 particles of ×5000 SEM image illustrated in FIG. 2, measuring the particle diameter along the short axis for all the particles in contact with the circle, and calculating the average particle diameter. However, for coarse particles, ×500 SEM image is used, while for fine particles, ×10000 SEM image is enlarged (400%) to give a copy, which is then used for measurement after drawing a circle as explained above.

In the present invention, the silicon nitride powder used for a release layer can be obtained by a method which includes pulverizing a nitrogen-containing silane compound obtained by reaction between silicon halide and ammonia or non-crystalline silicon nitride powder obtained by thermal decomposition of the nitrogen-containing silane compound and briefly pulverizing it after crystallization (i.e., imide method).

Controlling particle size and particle shape of silicon nitride powder in the imide method can be performed by adjustment of crystallization rate based on heating temperature and oxygen content for thermal decomposition at the time of preparing non-crystalline silicon nitride powder and adjustment of particle growth rate based on temperature increase rate during calcination for crystallization.

When non-crystalline silicon nitride powder is prepared, as heating temperature for thermal decomposition is higher and also oxygen content in the obtained non-crystalline silicon nitride powder is higher, the crystallization starts at higher temperature and crystallization rate becomes faster. Further, since high temperature increase rate between 1100 and 1250° C. is employed, needle-like crystal particles or fine agglomerate particles are easily produced in conjunction with rapid progress of crystallization, and as a result, it becomes difficult to obtain silicon nitride powder with uniform particle size. On the other hand, as the heating temperature for thermal decomposition to prepare non-crystalline silicon nitride powder is lower and also the oxygen content in non-crystalline silicon nitride powder is smaller, the crystallization starts at lower temperature, yielding lower crystallization rate. Further, since low temperature increase rate between 1100 and 1250° C. is used, the crystalline particle growth progresses more slowly, and thus coarse particulate crystalline particles are easily obtained and silicon nitride powder with uniform particle size is obtained. Particulate crystals of silicon nitride powder indicate the particles of hexagonal system with aspect ratio of 1.5 or less, that are not needle-like crystals or columnar crystals. It is possible to prepare, by controlling a preparation condition based on the above characteristics, the silicon nitride powder (A) having an average particle diameter along the short axis of 0.6 to 13 μm and the silicon nitride powder (B) having an average particle diameter along the short axis of 0.1 to 0.3 μm.

Further, by pulverizing the obtained non-crystalline silicon nitride powder to the extent that coarse agglomerate particles with particle diameter of 50 μm or more in terms of particle diameter according to the volumetric particle size distribution, which is measured by using laser diffraction scattering method, are not contained, production of particles with non-uniform particle size and particle diameter due to simultaneous production of coarse particles, needle-like crystal particles, and fine agglomerate particles due to abnormal crystal growth during calcination for crystallization are suppressed, and thus it becomes possible to produce silicon nitride powder with uniform particle size.

The silicon nitride powder prepared by the method described above is fine particles. Further, although there is a step of briefly pulverizing the agglomerate, the medium used for pulverization is a metal ball coated with resin or a sintered silicon nitride product, and thus the incorporation amount of metal impurities is extremely small, i.e., in several ppm or so, and thus it is a powder suitable for a raw material of mold release material for a polycrystalline silicon ingot casting mold. As described in JP 2007-261832 A, electric power generation efficiency of a solar cell is impaired by metal impurities that are included in a silicon ingot. It is particularly believed that the efficiency impairment is significant when polyvalent metals are incorporated. It is well known that the purity of a raw powder material itself as a mold release material has an influence on power generation efficiency, and thus less incorporation amount of metal impurities in a raw powder material as a mold release material is believed to be desirable. Preferred examples of the imide method include those described in JP 2907366 B1, JP 2907367 B1, and JP 3282456 B1. With regard to the imide method, by controlling heating temperature for thermal decomposition and oxygen content at the time of producing non-crystalline silicon nitride powder and also by controlling temperature increase rate during calcination for crystallization, silicon nitride powder with different particle diameter can be obtained.

Examples of the nitrogen-containing silane compound as a raw material include silicon diimide ($Si(NH)_2$), silicon tetraamide, silicon nitride imide, and silicon chloroimide. They are prepared by a method known in the art, for example, a method of reacting silicon halide such as silicon tetrachloride, silicon tetrabromide, or silicon tetraiodide with ammonia in gas phase or a method of reacting the silicon halide in liquid phase with liquid ammonia. Further, as for the non-crystalline silicon nitride powder, non-crystalline silicon nitride powder prepared by a known method, for example, thermal decomposition of the nitrogen-containing silane compound in the temperature range of 1200 to 1460° C. under nitrogen or ammonia gas atmosphere or a method of reacting silicon halide such as silicon tetrachloride, silicon tetrabromide, or silicon tetraiodide with ammonia at high temperature, are used.

Figure 3:
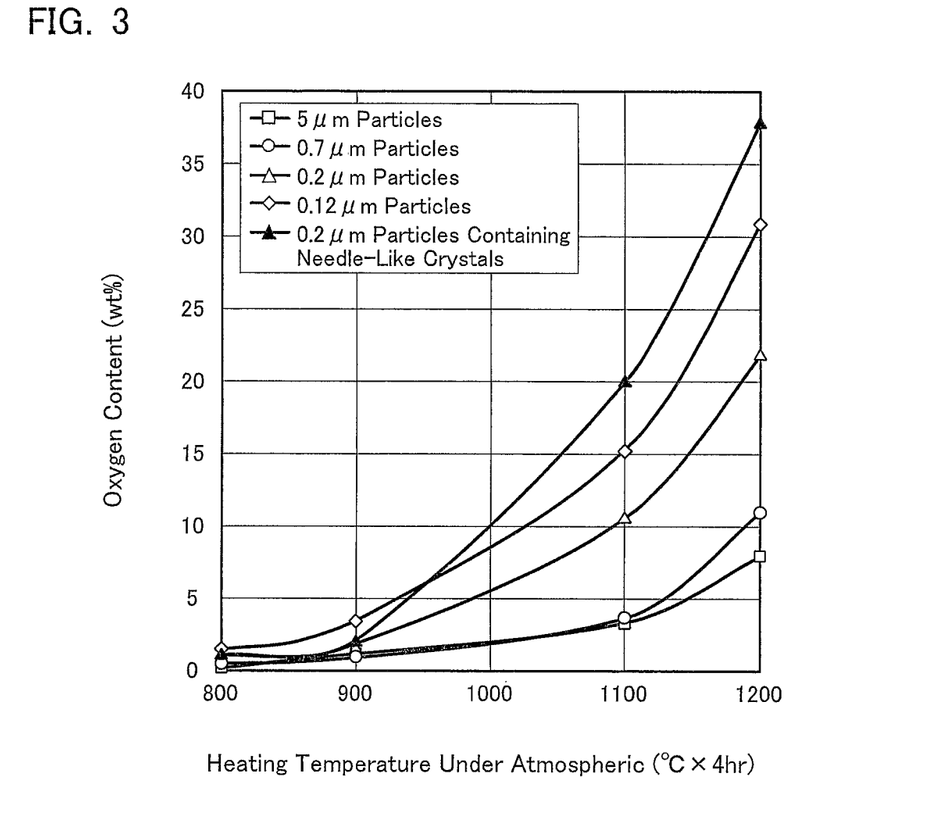
FIG. 3 is a diagram illustrating a difference in oxidation behavior of silicon nitride powder having different particle diameter.

Further, by taking advantage of a difference in oxidation rate depending on particle size illustrated in FIG. 3, a pre-determined amount of oxygen can be included in the silicon nitride powder by a heating treatment under oxygen-containing atmosphere. For such case, silicon nitride powder having fine particle size is more prone to oxidation by heating under oxygen-containing atmosphere, while silicon nitride powder having coarse particle size is less prone to oxidation. Accordingly, silicon nitride powder having oxidized particle surface with different oxygen content can be prepared by an oxidation treatment under heating at a pre-determined temperature, and thus the silicon nitride powder (A) having an average particle diameter along the short axis of 0.6 to 13 μm and an oxygen content of 0.3 to 1.0% by weight (hereinbelow, referred to as the silicon nitride powder (A)) and the silicon nitride powder (B) having an average particle diameter along the short axis of 0.1 to 0.3 μm and an oxygen content of 1.3 to 20% by weight (hereinbelow, referred to as the silicon nitride powder (B)) can be prepared.

The silicon nitride powder (A) used for the forming of the slurry has an average particle diameter along the short axis of 0.6 to 13 μm, and preferably 0.66 to 12.9 μm. Further, it has oxygen content of 0.3 to 1.0% by weight, and preferably 0.37 to 0.96% by weight.

When the silicon nitride powder (A) has an average particle diameter along the short axis of less than 0.6 μm, there is only a small difference in particle diameter compared to the silicon nitride powder (B), and thus localizing particle size in the release layer by utilizing a different movement rate depending on particle size may not be achieved during coating the mold with a slurry blended with silicon nitride powder and having it absorbed onto the mold based on capillary force. On the other hand, for producing particles which have average particle diameter along the short axis of more than 13 μm, it is necessary that thermal decomposition temperature is lowered to temperature lower than 500° C., or temperature increase rate between 1100 and 1250° C. is lowered to rate of lower than 10° C./hr during calcination for crystallization without performing thermal decomposition, and thus the productivity is very poor and it is practically not useful.

Further, when oxygen content in the silicon nitride powder (A) is more than 1.0% by weight, although the adhesiveness among the particles of a release layer on silicon ingot side and strength of the release layer are improved, reactivity with silicon melt is increased as oxygen concentration is higher, and therefore undesirable. When oxygen content in the silicon nitride powder (A) is less than 0.3% by weight, lower adhesiveness between particles and lower strength of a release layer are obtained, which leads to peeling of a release layer, and therefore undesirable.

The silicon nitride powder (A) can be obtained by an imide method, for example, and by adjusting heating temperature for thermal decomposition during preparation of non-crystalline silicon nitride powder, oxygen concentration in obtained non-crystalline silicon nitride powder, and temperature increase rate during calcination for crystallization, the average particle diameter along the short axis and oxygen content in the silicon nitride powder (A) can be controlled.

Specifically, the silicon nitride powder (A) can be obtained by a process in which heating temperature for thermal decomposition for preparing non-crystalline silicon nitride powder is adjusted to 500 to 800° C., oxygen concentration in a gas introduced during thermal decomposition is adjusted to less than 2 vol %, the non-crystalline silicon nitride powder is pulverized to the extent that coarse agglomerate particles with particle diameter of 50 μm or more in terms of particle diameter according to the volumetric particle size distribution, which is measured by using laser diffraction scattering method, are not contained, and the temperature increase rate between 1100 and 1250° C. during calcination for crystallization is adjusted to 10 to 50° C./hr.

For example, when the heating temperature for thermal decomposition is higher than 800° C. during preparation of non-crystalline silicon nitride powder, even when the temperature increase rate between 1100 and 1250° C. during calcination for crystallization is adjusted to 10 to 50° C./hr, the average particle diameter along the short axis of the powder obtained after calcination for crystallization becomes easily less than 0.6 μm, and further, as the non-crystalline silicon nitride powder having high crystallization rate is used as a raw material, needle-like crystal particles or fine agglomerate particles are produced, and thus it is difficult to produce silicon nitride powder with uniform particle size and it is also difficult to produce the silicon nitride powder (A) having an average particle diameter along the short axis of 0.6 μm or more, and therefore undesirable.

When the heating temperature for thermal decomposition is between 500 to 800° C. during preparation of non-crystalline silicon nitride powder and oxygen content in the obtained non-crystalline silicon nitride powder is low, silicon nitride powder having larger average particle diameter along the short axis can be produced by further lowering the temperature increase rate between 1100 and 1250° C. during calcination for crystallization to slow down the progress of crystallization particle growth.

Further, if there are coarse agglomerate particles with particle diameter of 50 μm or more in terms of particle diameter according to the volumetric particle size distribution, which is measured by using laser diffraction scattering method of the non-crystalline silicon nitride powder, coarse particles, needle-like crystal particles, and fine agglomerate particles are simultaneously produced in the coarse agglomerate particles due to abnormal crystal growth occurred during calcination for crystallization, so that particles with nonuniform particle size and particle diameter are produced, making it impossible to produce silicon nitride powder with uniform particle size, it becomes difficult to control the particle diameter, and therefore undesirable.

Further, when the temperature increase rate between 1100 and 1250° C. during calcination for crystallization is higher than 50° C./hr, it is difficult to control particle growth rate due to rapid crystallization, easily yielding needle-like crystal particles or fine agglomerate particles, and therefore it is difficult to produce uniform silicon nitride powder with an average particle diameter along the short axis of 0.6 μm or more. Further, even when the temperature increase rate between 1100 and 1250° C. is lower than 10° C./hr, although the silicon nitride powder (A) with an average particle diameter along the short axis of 0.6 to 13 μm can be produced, time is required for calcination for crystallization to thereby degrade the productivity, and thus undesirable.

Further, even without undergoing an oxidation step again, by performing calcination for crystallization of the obtained non-crystalline silicon nitride powder as a raw material, the silicon nitride powder (A) having oxygen content in the range of 0.3 to 1.0% by weight can be obtained.

Specifically, when a silicon nitride powder having an average particle diameter along the short axis of 13 μm is to be produced, for example, by setting heating temperature for thermal decomposition for producing a non-crystalline silicon nitride powder to 500° C. and oxygen concentration in the gas introduced during thermal decomposition to less than 1 vol %, a non-crystalline silicon nitride powder which enables lowering the crystallization start temperature during calcination for crystallization and slowing the crystallization rate can be produced, and then it is pulverized to the extent that coarse agglomerate particles with particle diameter of 50 μm or more in terms of particle diameter according to the volumetric particle size distribution, which is measured by using laser diffraction scattering method, are not contained in the non-crystalline silicon nitride powder. By using such non-crystalline silicon nitride powder and setting the temperature increase rate between 1100 and 1250° C. during calcination for crystallization to 10° C./hr, the crystallization particle growth is allowed to occur slowly, and thus a silicon nitride powder having an average particle diameter along the short axis of 13 μm and oxygen content of the same or higher than 0.3% by weight but less than 0.6% by weight can be produced.

Further, when a silicon nitride powder having an average particle diameter along the short axis of 0.6 μm is to be produced, for example, by setting heating temperature for thermal decomposition for producing a non-crystalline silicon nitride powder to 500 to 800° C. and oxygen concentration in the gas introduced during thermal decomposition to less than 2 vol %, a non-crystalline silicon nitride powder which enables increasing the crystallization start temperature during calcination for crystallization and increasing the crystallization rate can be produced, and then the produced non-crystalline silicon nitride powder is pulverized to the extent that coarse agglomerate particles with particle diameter of 50 μm or more in terms of particle diameter according to the volumetric particle size distribution, which is measured by using laser diffraction scattering method, are not contained therein. By using such non-crystalline silicon nitride powder and setting the temperature increase rate between 1100 and 1250° C. during calcination for crystallization to 50° C./hr or less, the crystallization particle growth is allowed to occur slowly, and thus a silicon nitride powder having an average particle diameter along the short axis of 0.6 μm and oxygen content of the same or higher than 0.3% by weight but less than 1.0% by weight can be produced.

Since the silicon nitride powder (A) obtained by calcination for crystallization is in brief agglomerate particle state, when it is dispersed in water to prepare a slurry, slurry viscosity may easily increase. Thus, it is subjected to a brief pulverization treatment. For a step of briefly pulverizing agglomerate, the medium used for pulverization includes a metal ball coated with resin or a sintered product of silicon nitride. As the silicon nitride powder contains extremely small incorporation amount of metal impurities, i.e., in several ppm or so, it yields a powder suitable for a raw material of a mold release material of a polycrystalline silicon ingot casting mold.

The silicon nitride powder (B) used in the forming of the slurry has an average particle diameter along the short axis of 0.1 to 0.3 µm, and preferably 0.15 to 0.3 µm. Further, it has oxygen content of 1.3 to 20% by weight, and preferably 2 to 18% by weight.

When the silicon nitride powder (B) has an average particle diameter along the short axis of more than 0.3 µm, there is only a small difference in particle diameter compared to the silicon nitride powder (A), and thus localizing particle size in the release layer by utilizing a different movement rate depending on particle size cannot be achieved during coating the mold with a slurry blended with silicon nitride powder and having it absorbed onto a mold based on capillary force. Meanwhile, producing particles having an average particle diameter along the short axis of less than 0.1 µm is difficult to achieve by imide method which does not include a pulverization step. For example, when a non-crystalline silicon nitride powder which enables increasing oxygen concentration thereof, increasing the crystallization start temperature during calcination for crystallization and increasing the crystallization rate as a raw material by increasing heating temperature for thermal decomposition for producing non-crystalline silicon nitride powder to 1100° C. or higher and increasing the oxygen concentration in the non-crystalline silicon nitride powder by having oxygen concentration of 5 vol % or more in the gas introduced during thermal decomposition is used, if the temperature increase rate between 1100 and 1250° C. during calcination for crystallization is increased to rate of more than 100° C./hr, the production can be made. However, as the production ratio of needle-like crystal particles or ultra-fine agglomerate particles is also increased, a pulverizing step is necessary. Thus, for producing particles having an average particle diameter along the short axis of less than 0.1 µm, a pulverizing step is necessary, which inevitably leads to incorporation of metal impurities, and therefore it is undesirable as a raw material of a mold release material.

Further, when oxygen content in the silicon nitride powder (B) is more than 20% by weight, reactivity with silicon melt is increased, and therefore undesirable. On the other hand, when oxygen content in the silicon nitride powder (B) is less than 1.3% by weight, adhesiveness among particles is poor even after baking the release layer, which leads to lower strength and peeling of a release layer, and therefore undesirable.

Similar to the silicon nitride powder (A), the silicon nitride powder (B) can be obtained by an imide method, for example, and by adjusting heating temperature for thermal decomposition during preparation of non-crystalline silicon nitride powder, oxygen concentration in obtained non-crystalline silicon nitride powder, and temperature increase rate during calcination for crystallization, the average particle diameter along the short axis can be adjusted. Subsequently, by performing an oxidation calcination treatment, surface of the silicon nitride particle is oxidized, and therefore powder with controlled oxygen content can be obtained.

By increasing the heating temperature for thermal decomposition for producing non-crystalline silicon nitride powder and increasing oxygen concentration in obtained non-crystalline silicon nitride powder, crystalline particle powder which has higher crystallization start temperature, higher crystallization rate, and smaller average particle diameter along the short axis can be obtained. However, to suppress abnormal particle growth during calcination for crystallization or production of mixed particles including needle-like crystal particles and fine agglomerate particles, it is necessary to carry out the pulverization to the extent that coarse agglomerate particles with particle diameter of 50 µm or more in terms of particle diameter according to the volumetric particle size distribution, which is measured by using laser diffraction scattering method, are not contained in the non-crystalline silicon nitride powder. Further, by adjusting the temperature increase rate between 1100 and 1250° C. during calcination for crystallization and suppressing formation of needle-like crystal particles and fine agglomerate particles, which is accompanied with rapid progress of crystallization, calcined silicon nitride powder with uniform particle size can be produced.

Specifically, the silicon nitride powder (B) can be obtained by a process in which heating temperature for thermal decomposition for preparing non-crystalline silicon nitride powder is adjusted to 800 to 1100° C., oxygen concentration in a gas introduced during thermal decomposition is adjusted to the same or higher than 2.2 vol % but less than 5 vol %, thus obtained non-crystalline silicon nitride powder is pulverized to the extent that coarse agglomerate particles with particle diameter of 50 µm or more in terms of particle diameter according to the volumetric particle size distribution, which is measured by using laser diffraction scattering method, are not contained, and the temperature increase rate between 1100 and 1250° C. during calcination for crystallization is adjusted to 50 to 100° C./hr to produce powder after calcination for crystallization, and then the obtained powder after calcination for crystallization is subjected to an oxidation treatment by heating at 800 to 1200° C. for 0.25 to 4 hr under oxygen-containing gas atmosphere.

When the temperature is lower than 800° C., almost no oxidation occurs during an oxidation treatment by heating under oxygen-containing gas atmosphere to produce the silicon nitride powder (B), and it is difficult to obtain silicon nitride powder with desired oxygen content. On the other hand, when the heating temperature for oxidation treatment by heating is higher than 1200° C., the oxidation occurs very rapidly, making it difficult to control oxygen content and yielding higher reactivity with silicon melt due to excessive oxidation, and therefore undesirable. In this regard, by performing an oxidation treatment by heating at a pre-determined temperature of 800 to 1200° C. for 0.25 to 4 hr under oxygen-containing gas atmosphere, it is possible to obtain the silicon nitride powder (B) having an average particle diameter along the short axis of 0.1 to 0.3 µm and an oxygen content of 1.3 to 20% by weight.

Further, when the heating temperature for thermal decomposition for producing non-crystalline silicon nitride powder is higher than 1100° C. and the obtained non-crystalline silicon nitride powder is used as a raw material, the crystallization start temperature becomes even higher and the crystallization rate becomes even higher during crystallization, and thus even if the temperature increase rate between 1100 and 1250° C. during calcination for crystallization is controlled, it is difficult to produce a silicon nitride powder having uniform particle size with an average particle diameter along the short axis of 0.1 to 0.3 µm. In addition, the formation ratio of needle-like crystal particles or fine agglomerate particles is higher in the powder after calcination for crystallization, and density of a release layer is lower after coating. In addition, the difference in movement rate depending on particle size during coating the mold with the slurry blended with the silicon nitride powder and having it absorbed based on capillary force of a mold may not be utilized as it is hampered by needle-like crystal particles, and therefore undesirable. When a non-crystalline silicon nitride powder having heating temperature for thermal decomposition of lower than 800° C. is used as a raw material, the crystallization start temperature is lower and the crystallization rate is lower, making it difficult to obtain powder after calcination having an average particle diameter along the short axis of 0.3 μm or less, and therefore a silicon nitride powder having uniform particle size with an average particle diameter along the short axis of 0.1 to 0.3 μm may not be obtained.

Meanwhile, depending on oxygen content in non-crystalline silicon nitride powder, particle shape or particle size varies in the powder after calcination for crystallization. For example, when the oxygen concentration in a gas introduced for thermal decomposition for producing non-crystalline silicon nitride powder is 5 vol % or more, needle-like crystal particles or fine agglomerate particles are easily formed during calcination for crystallization, lowering the density of a coated release layer, and therefore undesirable. Further, when the oxygen concentration in a gas introduced for thermal decomposition for producing non-crystalline silicon nitride powder is increased to a higher value, silicon oxynitride particles having different crystal shape are yielded, which leads to localization of an oxidized layer on surface of original silicon nitride particles, and as a result, adhesiveness during baking and strength of a coated release layer may not be improved, and therefore undesirable.

Further, when the temperature increase rate between 1100 and 1250° C. during calcination for crystallization is higher than 100° C./hr, needle-like crystal particles or fine agglomerate particles are produced due to rapid crystallization and rapid particle growth, making it difficult to control particle size of an average particle diameter along the short axis of 0.1 μm or higher, and therefore undesirable.

Specifically, when a silicon nitride powder having an average particle diameter along the short axis of 0.1 μm is to be produced, for example, by setting heating temperature for thermal decomposition for producing a non-crystalline silicon nitride powder to 900 to 1100° C. and oxygen concentration in the gas introduced during thermal decomposition to 4 to 5 vol %, a non-crystalline silicon nitride powder which enables increasing the crystallization start temperature during calcination for crystallization and increasing the crystallization rate is produced, and then the produced non-crystalline silicon nitride powder is pulverized to the extent that coarse agglomerate particles with particle diameter of 50 μm or more in terms of particle diameter according to the volumetric particle size distribution, which is measured by using laser diffraction scattering method, are not contained therein. By using such non-crystalline silicon nitride powder and setting the temperature increase rate between 1100 and 1250° C. during calcination for crystallization to 70 to 100° C./hr, the crystallization particle growth is allowed to occur fast and also formation of needle-like crystal particles and fine agglomerate particles, which is accompanied with rapid progress of crystallization, is suppressed, and therefore a calcined silicon nitride powder having uniform particle size with an average particle diameter along the short axis of 0.1 μm can be obtained. In addition, according to an oxidation treatment of the obtained silicon nitride powder by heating at 1120° C. for 4 hr under oxygen-containing atmosphere, a silicon nitride powder with oxygen content of 20% by weight can be produced.

Further, when a silicon nitride powder of 0.3 μm is to be produced, for example, a non-crystalline silicon nitride powder which enables increasing the crystallization start temperature during crystallization and increasing the crystallization rate by setting heating temperature for thermal decomposition for producing a non-crystalline silicon nitride powder to 800 to 900° C. and oxygen concentration in the gas introduced during thermal decomposition to 2.2 to 4 vol % is used. Further, the produced non-crystalline silicon nitride powder is pulverized to the extent that coarse agglomerate particles with particle diameter of 50 μm or more in terms of particle diameter according to the volumetric particle size distribution, which is measured by using laser diffraction scattering method, are not contained therein. By using such non-crystalline silicon nitride powder and setting the temperature increase rate between 1100 and 1250° C. during calcination for crystallization to 60 to 80° C./hr, the crystallization particle growth is allowed to occur fast and also formation of needle-like crystal particles and fine agglomerate particles, which is accompanied with rapid progress of crystallization, is suppressed, and therefore a calcined silicon nitride powder having uniform particle size with an average particle diameter along the short axis of 0.3 μm can be obtained. In addition, according to an oxidation treatment of the obtained silicon nitride powder by heating at 1130° C. for 4 hr under oxygen-containing atmosphere, a silicon nitride powder with oxygen content of 12% by weight can be produced.

Since the silicon nitride powder (B) obtained by calcination for crystallization is in brief agglomerate particle state, when it is dispersed in water prepare a slurry, slurry viscosity may easily increase. Thus, it is subjected to a brief pulverization treatment. For a step of briefly pulverizing agglomerate, the medium used for pulverization includes a metal ball coated with resin or a sintered product of silicon nitride. As the silicon nitride powder contains extremely small incorporation amount of metal impurities, i.e., in several ppm or so, it yields a powder suitable for a raw material of a mold release material for a polycrystalline silicon ingot casting mold.

With regard to the production method according to the present invention, it is important that blending of the silicon nitride powder (A) and the silicon nitride powder (B) is 5:5 to 9:1 in terms of weight ratio. When the weight ratio of the silicon nitride powder (B) is higher than 5:5, for example, particles size gradient in a release layer based on a difference in movement rate in accordance with particle size can be obtained during coating the mold with a slurry containing a blend of silicon nitride powders and absorbing it based on capillary force of the mold. However, on a side which is closer to a silicon ingot side than the state illustrated in FIG. 1, ratio of fine particles increases and, although the overall adhesiveness and strength of a release layer are improved even at low baking temperature, there is a high risk of generating cracks or damages by shrinkage during baking. In addition, as the oxygen concentration in a release layer at silicon ingot side is higher, the reactivity with silicon melt is increased, and therefore undesirable. Further, when the weight ratio of the silicon nitride powder (B) is lower than 9:1, for example, adhesiveness of a release layer with a mold and strength of a release layer are significantly lowered, and therefore undesirable.

The slurry containing silicon nitride powder, which is used for the forming of the slurry, is a slurry containing silicon nitride powder for forming a release layer of a polycrystalline silicon ingot casting mold, in which a silicone powder obtained by blending the silicon nitride powder (A) and the silicon nitride powder (B) having different particle size and different oxygen content described above at a weight ratio of 5:5 to 9:1 is dispersed in water.

Mixing of the slurry containing silicon nitride powder can be carried out by adding the silicon nitride powder to a vessel together with distilled water, filling a metal ball coated with a resin or a ball of sintered product of silicon nitride, and mixing for a pre-determined time using a mixing crusher such as vibration mill, ball mill, and paint shaker, and when no ball is used, using a stirrer with wing such as paddle wing, or a high-speed planetary stirrer. However, a treatment of long period of time using a wet-type attriter or a bead mill having high crushing efficiency is undesirable, because there is a risk of having impurities incorporated from a medium or a vessel or having high viscosity.

In the method of producing a polycrystalline silicon ingot casting mold having a release layer according to the present invention, the coating step of the slurry is a step of coating mold surface with the slurry containing silicon nitride powder, while maintaining the fluidity of the particles. The slurry containing silicon nitride powder is used for coating a mold release material, by which inner surface of a quartz crucible with porosity of 16 to 26% as a mold is coated with a release material using a spray, a brush, or a spatula, and the fluidity is preferably maintained such that the coated slurry is not released from a mold to the extent that it does not inhibit the movement of silicon nitride particles in a coated release layer.

With regard to the slurry containing silicon nitride powder with which a mold is coated, due to absorption based on capillary phenomenon caused by fine pores present in the mold, fine particles are attracted more to the mold near mold surface region. As a result, a release layer in which fine particles are localized on an inner side (i.e., mold side) while coarse particles are localized on an outer side (i.e., silicon ingot side) by reduction of fine particles is formed, and a state of the conceptual diagram of FIG. 1, which illustrates the localized state of particles in a release layer, is obtained. Thus, when viscosity of the slurry containing silicon nitride powder is 500 P (poise) or higher, movement rate of silicon nitride particles in a release layer coated with the slurry containing silicon nitride powder is slow, and thus it is difficult to have particle localization. In addition, when viscosity of the slurry containing silicon nitride powder described above is 1.5 cP (centipoise) or lower, the release layer coated with the slurry containing silicon nitride powder is easily sagged, making it difficult to maintain the release layer. Thus, it is necessary to adjust the slurry viscosity which can maintain fluidity of the particles and does not allow any sagging.

When a release layer is formed by using the slurry containing silicon nitride powder according to the present invention, compared to a case in which each of slurries with different mixing ratio of silicon nitride powder and fine silica powder is coated as described in Patent Literature 1, for example, it is unnecessary to worry about forming of an imperfect release layer that is caused by an incorrect coating order, since the same single slurry is coated. In addition, even with a single coating, a sufficient effect of a release layer is obtained, and the effect is not impaired by multi-layer coating. Further, as permeation of silicon melt is prohibited and releasability of a solidified silicon ingot is improved, high yield is obtained.

The method for producing a polycrystalline silicon ingot casting mold having a release layer according to the present invention may further include a step of permeating moisture of slurry into the mold in order to have more sufficient absorption of the coated slurry containing silicon nitride powder based on capillary phenomenon by fine pores in a mold. The step of permeating moisture includes drying at 30 to 120° C.

As described in FIG. 1, as a result of permeating moisture, it is possible to form a layer in which fine particles with high oxygen content are localized on a mold side in release layer and coarse particles with low oxygen concentration are localized on a silicon ingot side, and the shrinkage stress during drying is compensated with adhesiveness of fine particles with high oxygen content that are present on a mold side.

Further, since the baking for improving adhesiveness of a release layer can be performed at low temperature such as 400 to 800° C. compared to conventional high temperature such as 800 to 1200° C., shrinkage stress during baking can be reduced, and thus a release layer having high purity and high density without an occurrence of cracks or peeling phenomenon can be simply produced at low cost, and excellent adhesion strength between particles which constitute the release layer and to the mold can be obtained and permeation of melt caused by cracks or damages in a release layer can be prevented.

Further, in the method for producing a polycrystalline silicon ingot casting mold having a release layer according to the present invention, the heating is a step for carrying out a heating treatment of a mold coated with the slurry containing silicon nitride powder at 400 to 800° C. under oxygen-containing atmosphere. When the baking temperature of a release layer is lower than 400° C., melt-adhesion between particles of a release layer does not occur and adhesiveness and strength are poor, and therefore undesirable. On the other hand, when the baking temperature of a release layer is higher than 800° C., shrinkage stress is high during baking and permeation of silicon melt may occur due to cracks or damages in release layer, and therefore undesirable.

Further, since it is possible to lower the oxygen concentration in a release layer on silicon ingot side after baking, the reactivity with silicon melt is lowered. By using a polycrystalline silicon ingot casting mold having such release layer, the solid solution reaction between silicon melt and release layer is suppressed, and thus the releasability of a solidified silicon ingot from a mold can be greatly improved and also, by suppressing an occurrence of losses or damages during release of a solidified silicon ingot, a high-quality silicon ingot can be obtained at high yield.

The polycrystalline silicon ingot casting mold produced by the method for producing a polycrystalline silicon ingot casting mold having a release layer according to the present invention is a mold for cast molding of a polycrystalline silicon ingot, which includes a release layer containing silicon nitride powder formed on an inner side of a mold. In the release layer, easily oxidizable fine particles with high oxygen content are localized on the inner side (i.e., mold side) while hardly oxidizable coarse particles with low oxygen content are localized on the outer side (i.e., silicon ingot side), and therefore the mold side has high oxygen content and the silicon ingot side has low oxygen content. By using a polycrystalline silicon ingot casting mold having such release layer, the inner side (i.e., mold side) of the release layer exhibits close adhesion between particles, that are oxidized by baking for calcination under oxygen-containing atmosphere, and close adhesion between particles and a mold, and the outer side (i.e., silicon ingot side) of the release layer has lower oxygen concentration and can prevent permeation by suppressing solid solution of silicon melt, and thus the releasability of a solidified silicon ingot from a mold is greatly improved. Further, an occurrence of losses or damages during releasing the solidified silicon ingot is suppressed, and thus a high-quality silicon ingot can be obtained at high yield. The material of a mold is not particularly limited, and examples that can be generally used include a quartz crucible and a quartz crucible installed within a graphite crucible.

The polycrystalline silicon ingot casting mold related to the present invention has, on the inner wall side of a mold, a release layer formed of a mold release material in which the silicon nitride powder (A) and the silicon nitride powder (B) described above are blended at a weight ratio of 5:5 to 9:1. Specifically, it is a mold obtained by coating the inner wall surface of a quartz crucible or a quartz crucible which may be installed within a graphite crucible, having porosity ratio of 16 to 26%, while the slurry containing silicon nitride powder of the present invention using a spray, a brush, or a spatula followed by drying at 30 to 120° C., performing a baking treatment by heating at a pre-determined temperature of 400 to 800° C. under an atmospheric condition, and fixing a release layer onto a mold.

By using the silicon nitride powder according to the present invention, a release layer having a dense layer with high adhesion strength on a mold side of an inner wall of a mold for casting silicon ingot and a layer having suppressed reactivity with silicon melt on silicon ingot side can be formed at low cost, and with suppressed occurrence of losses or damages during releasing a solidified silicon ingot, a high-quality silicon ingot can be obtained at high yield.

Further, the mold for polycrystalline silicon casting according to the present invention is a mold having the release layer formed on an inner wall surface of the mold, and the mold for polycrystalline silicon casting of the invention has, compared to a mold disclosed in Patent Literature 1, for example, in which a release layer is formed by coating the mold with each of slurries with different mixing ratio of silicon nitride powder and fine silica powder, lower reactivity with silicon melt and improved releasability of a solidified silicon ingot, and therefore can exhibit high yield.

EXAMPLES

Herein below, the present invention is explained in greater detail in view of the specific examples.

Examples 1 to 9

First, silicon diimide required for the present invention is prepared by reacting a toluene solution in which silicon tetrachloride concentration is 30 vol % with liquid ammonia followed by washing with liquid ammonia and drying.

Next, the silicon diimide powder was subjected to thermal decomposition at 500 to 800° C. under flow of air-nitrogen mixture gas (oxygen concentration in the mixture gas: 0.4 to 2 vol %) in an amount of 70 liter/hr per kilogram of powder to obtain a non-crystalline silicon nitride powder for producing the silicon nitride powder (A). The resulting non-crystalline silicon nitride powder was pulverized by using a continuous vibration mill filled with metal balls coated with nylon, and then added to a crucible made of carbon, and the temperature was increased from room temperature to 1100° C. for 4 hours, from 1100° C. to 1250° C. at 10 to 50° C./hr, and from 1250° C. to 1550° C. for 4 hours. After keeping it at 1550° C. for 1 hr followed by cooling, the powder was taken out and subjected to brief pulverization for agglomerate by using a continuous vibration mill filled with metal balls coated with nylon or balls of sintered product of silicon nitride to obtain the silicon nitride powder (A) having an average particle diameter along the short axis of 0.66 to 12.9 μm and oxygen content of 0.37 to 0.96% by weight.

Specifically, the silicon nitride powder (A) described in Examples 1 to 4 was produced as follows. First, the silicon diimide powder was subjected to thermal decomposition at a heating temperature to 500° C. in an oxygen concentration in the gas introduced for thermal decomposition adjusted to 0.4 vol % to produce a non-crystalline silicon nitride powder. The obtained non-crystalline silicon nitride powder was pulverized using a continuous vibration mill filled with metal balls coated with nylon to the extent that coarse agglomerate particles with particle diameter of 50 μm or more in terms of particle diameter according to the volumetric particle size distribution, which is measured by laser diffraction scattering method, are not contained. The pulverized non-crystalline silicon nitride powder was added to a crucible made of graphite, and the temperature was increased to 1100° C. for 4 hours, from 1100 to 1250° C. at 10° C./hr, and to 1550° C. for 4 hours. After keeping and calcining it at 1550° C. for 1 hr followed by cooling, the powder was taken out and subjected to brief pulverization by using a continuous vibration mill filled with metal balls coated with nylon to obtain silicon nitride powder according to Examples 1 to 4, which has an average particle diameter along the short axis of 12.9 μm and oxygen content of 0.37% by weight.

Next, the silicon nitride powder (A) described in Examples 5 to 7 was prepared as follows. First, the silicon diimide powder was subjected to thermal decomposition adjusted to 700° C. in an oxygen concentration in the gas introduced for thermal decomposition adjusted to 0.9 vol % to produce a non-crystalline silicon nitride powder. The obtained non-crystalline silicon nitride powder was pulverized using a continuous vibration mill filled with metal balls coated with nylon to the extent that coarse agglomerate particles with particle diameter of 50 μm or more in terms of particle diameter according to the volumetric particle size distribution, which is measured by laser diffraction scattering method, are not contained. The pulverized non-crystalline silicon nitride powder was added to a crucible made of graphite, and the temperature was increased to 1100° C. for 4 hours, from 1100 and 1250° C. at 20° C./hr, and to 1550° C. for 4 hours. After keeping and calcining it at 1550° C. for 1 hr followed by cooling, the powder was taken out and subjected to brief pulverization by using a continuous vibration mill filled with metal balls coated with nylon to obtain silicon nitride powder according to Examples 5 to 7, which has an average particle diameter along the short axis of 6.6 μm and oxygen content of 0.52% by weight.

Next, the silicon nitride powder (A) described in Examples 8 and 9 was prepared as follows. First, the silicon diimide powder was subjected to thermal decomposition at a heating temperature adjusted to 800° C. in an oxygen concentration in the gas introduced for thermal decomposition adjusted to 1.8 vol % to produce a non-crystalline silicon nitride powder. The obtained non-crystalline silicon nitride powder was pulverized using a continuous vibration mill filled with metal balls coated with nylon to the extent that coarse agglomerate particles with particle diameter of 50 μm or more in terms of particle diameter according to the volumetric particle size distribution, which is measured by laser diffraction scattering method, are not contained. The pulverized non-crystalline silicon nitride powder was added to a crucible made of graphite, and the temperature was increased to 1100° C. for 4 hours, from 1100 and 1250° C. at 50° C./hr, and to 1550° C. for 4 hours. After keeping and calcining it at 1550° C. for 1 hr followed by cooling, the powder was taken out and subjected to brief pulverization by using a continuous vibration mill filled with metal balls coated with nylon to obtain silicon nitride powder according to Examples 8 and 9, which has an average particle diameter along the short axis of 0.66 μm and oxygen content of 0.96% by weight.

Further, as a next step, the silicon diimide powder was subjected to thermal decomposition at 800 to 1100° C. under flow of air-nitrogen mixture gas (oxygen concentration in the mixture gas: 3.5 to 4.7 vol %) in an amount of 70 liter/hr per kilogram of powder to obtain a non-crystalline silicon nitride powder for producing the silicon nitride powder (B). The resulting non-crystalline silicon nitride powder was pulverized by using a continuous vibration mill filled with metal balls coated with nylon, and then added to a crucible made of carbon, and the temperature was increased from room temperature to 1100° C. for 4 hours, from 1100° C. to 1250° C. at 50 to 100° C./hr, and from 1250° C. to 1550° C. for 4 hours. After keeping it at 1550° C. for 1 hr followed by cooling, the powder was taken out and subjected to brief pulverization of agglomerate by using a continuous vibration mill filled with metal balls coated with nylon or balls of sintered product of silicon nitride to obtain, after oxidation calcination, the silicon nitride powder (B) having an average particle diameter along the short axis of 0.18 to 0.29 μm and oxygen content of 1.4 to 18.1% by weight.

Specifically, the silicon nitride powder (B) described in Examples 1 to 3 was prepared as follows. First, the silicon diimide powder, was subjected to thermal decomposition at a heating temperature adjusted to 800° C. in an oxygen concentration in the gas introduced for thermal decomposition adjusted to 3.8 vol % to produce a non-crystalline silicon nitride powder. The obtained non-crystalline silicon nitride powder was pulverized using a continuous vibration mill filled with metal balls coated with nylon to the extent that coarse agglomerate particles with particle diameter of 50 μm or more in terms of particle diameter according to the volumetric particle size distribution, which is measured by laser diffraction scattering method, are not contained. The pulverized non-crystalline silicon nitride powder was added to a crucible made of graphite, and the temperature was increased to 1100° C. for 4 hours, from 1100 to 1250° C. at 60° C./hr, and to 1550° C. for 4 hours. After keeping and calcining it at 1550° C. for 1 hr followed by cooling, the calcined powder was taken out and subjected to brief pulverization by using a continuous vibration mill filled with metal balls coated with nylon to obtain silicon nitride powder having an average particle diameter along the short axis of 0.29 μm. Subsequently, after the brief pulverization, the silicon nitride powder having an average particle diameter along the short axis of 0.29 μm was densely laid in a dish-shaped alumina container to a thickness of 10 mm or so, and then subjected to oxidation calcination by keeping it for 4 hours in a batch type electric furnace at 1080° C. under atmospheric air flow followed by cooling to obtain the silicon nitride powder (B) according to Examples 1 to 3, which has an average particle diameter along the short axis of 0.29 μm and oxygen content of 7.6% by weight. After calcination by keeping for 4 hours in a batch type electric furnace at 1080° C. under atmospheric air flow, the powder exhibited slightly fused particles in a SEM image. However, when the SEM image (×10000 magnification) was enlarged by 400% to give a copy image, which was then used for measurement based on drawing a circle as described above, there was no change in the average particle diameter along the short axis.

Further, the silicon nitride powder (B) described in Example 4 was obtained by modifying the oxidation condition using a batch type electric furnace under atmospheric air flow, which has been used for producing the silicon nitride powder (B) of Examples 1 to 3. Specifically, the silicon nitride powder having an average particle diameter along the short axis of 0.29 μm was densely laid in a dish-shaped alumina container to a thickness of 10 mm or so in the same manner, and then subjected to oxidation calcination by keeping it for 4 hours in a batch type electric furnace at 1170° C. under atmospheric air flow followed by cooling to obtain the silicon nitride powder (B) according to Example 4, which has an average particle diameter along the short axis of 0.29 μm and oxygen content of 15.2% by weight. After calcination by keeping for 4 hours in a batch type electric furnace at 1170° C. under atmospheric air flow, the powder exhibited slightly fused particles in a SEM image. However, when the SEM image (×10000 magnification) was enlarged by 400% to give a copy image, which was then used for measurement based on drawing a circle as described above, there was no change in the average particle diameter along the short axis.

Further, the silicon nitride powder (B) described in Examples 7 and 9 were obtained by modifying the oxidation condition using a batch type electric furnace under atmospheric air flow, which has been used for producing the silicon nitride powder (B) of Examples 1 to 3. Specifically, the silicon nitride powder having an average particle diameter along the short axis of 0.29 μm was densely laid in a dish-shaped alumina container to a thickness of 10 mm or so in the same manner, and then subjected to oxidation calcination by keeping it for 4 hours in a batch type electric furnace at 1200° C. under atmospheric air flow followed by cooling to obtain the silicon nitride powder (B) according to Example 7 and 9, which has an average particle diameter along the short axis of 0.29 μm and oxygen content of 18.1% by weight. After calcination by keeping for 4 hours in a batch type electric furnace at 1200° C. under atmospheric air flow, the powder exhibited slightly fused particles in a SEM image. However, when the SEM image (×10000 magnification) was enlarged by 400% to give a copy image, which was then used for measurement based on drawing a circle as described above, there was no change in the average particle diameter along the short axis.

Subsequently, the silicon nitride powder (B) described in Example 5 was prepared as follows. First, the silicon diimide powder was subjected to thermal decomposition at a heating temperature adjusted to 1050° C. in an oxygen concentration in the gas introduced for thermal decomposition adjusted to 3 vol % to produce a non-crystalline silicon nitride powder. The obtained non-crystalline silicon nitride powder was pulverized using a continuous vibration mill filled with metal balls coated with nylon to the extent that coarse agglomerate particles with particle diameter of 50 μm or more in terms of particle diameter according to the volumetric particle size distribution, which is measured by laser diffraction scattering method, are not contained. The pulverized non-crystalline silicon nitride powder was added to a crucible made of graphite, and the temperature was increased to 1100° C. for 4 hours, from 1100 to 1250° C. at 100° C./hr, and to 1550° C. for 4 hours. After keeping and calcining it at 1550° C. for 1 hr followed by cooling, the powder was taken out and subjected to brief pulverization by using a continuous vibration mill filled with metal balls coated with nylon to obtain the silicon nitride powder (B) according to Example 5, which has an average particle diameter along the short axis of 0.18 μm and oxygen content of 1.4% by weight.

Further, with regard to the silicon nitride powder (B) described in Example 6, the silicon nitride powder (B) described in Example 5 was used, i.e., it was densely laid in a dish-shaped alumina container to a thickness of 10 mm or so, and then subjected to oxidation calcination by keeping it for 4 hours in a batch type electric furnace at 1080° C. under atmospheric air flow followed by cooling to obtain the silicon nitride powder (B), which has an average particle diameter along the short axis of 0.18 μm and oxygen content of 10.3% by weight. After calcination by keeping for 4 hours in a batch type electric furnace at 1080° C. under atmospheric air flow, the powder exhibited slightly fused particles in a SEM image. However, when the SEM image (×10000 magnification) was enlarged by 400% to give a copy image, which was then used for measurement based on drawing a circle as described above, there was no change in the average particle diameter along the short axis.

Further, with regard to the silicon nitride powder (B) described in Example 8, the silicon nitride powder (B) described in Example 5 was used, i.e., it was densely laid in a dish-shaped alumina container to a thickness of 10 mm or so, and then subjected to oxidation calcination by keeping it for 4 hours in a batch type electric furnace at 975° C. under atmospheric air flow followed by cooling to obtain the silicon nitride powder (B), which has an average particle diameter along the short axis of 0.18 μm and oxygen content of 5.5% by weight. After calcination by keeping for 4 hours in a batch type electric furnace at 975° C. under atmospheric air flow, the powder exhibited slightly fused particles in a SEM image. However, when the SEM image (×10000 magnification) was enlarged by 400% to give a copy image, which was then used for measurement based on drawing a circle as described above, there was no change in the average particle diameter along the short axis.

10 g of mixed silicon nitride powder obtained by mixing the silicon nitride powder (A) and (B) at a weight ratio of 5:5 to 9:1, 40 g of distilled water, and 100 g of silicon nitride balls (10 mm in diameter) were packed in a 100 cc polyethylene bottle, fixed on a vibration mill with amplitude of 5 mm and frequency of 1780 spm, and shaken for 5 min to give a 20% by weight aqueous slurry.

A quartz crucible (width×depth: 5 cm×4 cm) with porosity of 16%, which has been previously heated to 40° C., was coated with above 20% by weight aqueous slurry by spraying, followed by drying at 40° C. The quartz crucible after coating was again dried overnight at 40° C. After drying, the temperature was increased to a predetermined temperature of between 400 and 800° C. within 4 hours under atmospheric condition using a box type electric furnace. After keeping it for 4 hours at a predetermined temperature of between 400 and 800° C. followed by cooling, the release layer was baked onto the quartz crucible. Thickness of each release layer was 150 to 200 μm as an average value of five point measurement.

In the quartz crucible with baked release layer, 75 g of 2 to 5 mm Si granules having purity of 99.999% were filled. Using a box type electric furnace, it was maintained for 3 hours until 1000° C., 3 hours from 1000° C. to 1450° C., and 4 hours at 1450° C. under Ar flow of atmospheric pressure followed by cooling. After cooling, it was taken out of the furnace and observed for evaluating releasability. Further, Si melt permeation state in center bottom part of the crucible was observed with a naked eye. Further, after embedding the center bottom part of the crucible with an epoxy resin, a cross-section was cut out, and then a cross-sectional view of the release layer (×100 magnification) was obtained by using FE-SEM to observe and evaluate the Si melt permeation state. The results are described in the Table 1.

TABLE 1

| | Blend ratio of silicon nitride particles | | | | | | | Baking | | |
| --- | --- | --- | --- | --- | --- | --- | --- | --- | --- | --- |
| | Silicon nitride powder (A) | | | Silicon nitride powder (B) | | | | | Evaluation result of release layer | |
| | | Average particle | | | Average particle | | | temperature of mold | | |
| Classification | SSA ($m^2/g$) | diameter along the short axis (μm) | Oxygen content (wt %) | SSA ($m^2/g$) | diameter along the short axis (μm) | Oxygen content (wt %) | Mixing ratio based on weight | | under atmospheric air (° C.) | Permeation state of Si melt in crucible | Release state of silicon ingot |
| | | | | | | | (A) | (B) | | | |
| Example-1 | 0.2 | 12.9 | 0.37 | 7.0 | 0.29 | 7.6 | 5 | 5 | 700 | ◉ | ◉ |
| Example-2 | 0.2 | 12.9 | 0.37 | 7.0 | 0.29 | 7.6 | 7 | 3 | 700 | ○ | ◉ |
| Example-3 | 0.2 | 12.9 | 0.37 | 7.0 | 0.29 | 7.6 | 9 | 1 | 700 | ○ | ○ |
| Example-4 | 0.2 | 12.9 | 0.37 | 12.0 | 0.29 | 15.2 | 7 | 3 | 500 | ◉ | ◉ |
| Example-5 | 0.3 | 6.6 | 0.52 | 12.0 | 0.18 | 1.4 | 5 | 5 | 800 | ○ | ○ |
| Example-6 | 0.3 | 6.6 | 0.52 | 12.0 | 0.18 | 10.3 | 7 | 3 | 600 | ◉ | ◉ |
| Example-7 | 0.3 | 6.6 | 0.52 | 12.0 | 0.29 | 18.1 | 6 | 4 | 400 | ◉ | ◉ |
| Example-8 | 3.0 | 0.66 | 0.96 | 12.0 | 0.18 | 5.5 | 7 | 3 | 700 | ○ | ◉ |
| Example-9 | 3.0 | 0.66 | 0.96 | 12.0 | 0.29 | 18.1 | 7 | 3 | 500 | ◉ | ◉ |
| Comparative Example-1 | First layer(C1 0.22 μm Ox = 7.5 wt %) | | | Second layer (C1:silica powder = 9:1 mixing) | | | | | 800 | Δ | Δ |
| Comparative Example-2 | First layer(C1 0.22 μm Ox = 7.5 wt %) | | | Second layer (C1:silica powder = 8:2 mixing) | | | | | 800 | X | X |
| Comparative Example-3 | First layer(C2 0.65 μm Ox = 3.1 wt %) | | | Second layer (C2:silica powder = 8:2 mixing) | | | | | 800 | ○ | Δ |
| | Silicon nitride powder (D) | | | Silicon nitride powder (E) | | | (D) | (E) | | | |
| Comparative Example-4 | 0.2 | 12.9 | 0.37 | 7.0 | 0.29 | 7.6 | 3 | 7 | 700 | Δ | Δ |
| Comparative Example-5 | 0.2 | 12.9 | 0.37 | 7.0 | 0.29 | 26.3 | 5 | 5 | 400 | X | X |
| Comparative Example-6 | 0.3 | 6.6 | 0.20 | 12.0 | 0.18 | 10.3 | 3 | 7 | 600 | Δ | Δ |
| Comparative Example-7 | 3.0 | 0.66 | 0.96 | 12.0 | 0.18 | 15.2 | 3 | 7 | 500 | X | X |
| Comparative Example-8 | 3.0 | 0.66 | 2.1 | 12.0 | 0.18 | 5.5 | 7 | 3 | 700 | ○ | Δ |

In the permeation state of Si melt in crucible described in the Table 1, ◉ indicates that the permeation of silicon melt stops on surface of the release layer, ○ indicates that the permeation of silicon melt stops in the release layer, Δ indicates that a small amount of the silicon melt permeates into part of the quartz crucible, and x indicates that the silicon melt penetrates the quartz crucible and leaks from an opposite side of the bottom of crucible. Further, with regard to the release state of silicon ingot, ◉ indicates that it is completely released without any partial sticking to the quartz crucible, ○ indicates that releasing can be made although there is slight sticking to the quartz crucible, Δ indicates that the lateral side of the quartz crucible is released but the bottom side is sticking, and x indicates complete sticking to the entire quartz crucible, showing no release. Further, the specific surface area was measured by using Flow Sorb 2300 manufactured by SHIMADZU CORPORATION.

Comparative Examples 1 to 3

The silicon nitride powder (trade name: SN-E10, manufactured by Ube Industries, Ltd.) having an average particle diameter along the short axis of 0.22 μm, which is manufactured by thermal decomposition of silicon diimide, was subjected to heating treatment for 3 hours at 1075° C. using a batch type electric furnace under atmospheric air flow to obtain the silicon nitride powder (C1) having oxygen content of 7.5% by weight. In addition, the silicon nitride powder (trade name: SN-E03, manufactured by Ube Industries, Ltd.) of 0.65 μm was subjected to heating treatment for 3 hours at 950° C. using a batch type electric furnace under atmospheric air flow to obtain the silicon nitride powder (C2) having oxygen content of 3.1% by weight. The oxygen concentration was measured by using a TC-136 device for simultaneous analysis of oxygen and nitrogen, which is manufactured by LECO Corporation. 10 g of the silicon nitride powder (C1) or (C2), 40 g of distilled water, and 100 g of silicon nitride balls having a diameter of 10 mm were packed in a 100 cc polyethylene bottle, fixed on a vibration mill with amplitude of 5 mm and frequency of 1780 spm, and shaken for 5 min to give a 20% by weight aqueous slurry.

A quartz crucible (width×depth: 5 cm×4 cm) with porosity of 16%, which has been previously heated to 40° C., was coated with 20% by weight aqueous slurry of the silicon nitride powder (C1) in the Comparative Examples 1 and 2, and with 20% by weight aqueous slurry of the silicon nitride powder (C2) in the Comparative Example 3 by spraying, followed by drying at 40° C. The quartz crucible after coating was again dried overnight at 40° C.

Next, the silicon nitride powder (C1) described above and silica powder having an average particle diameter of 0.05 μm measured by a laser diffusion type particle size distribution analyzer, in which the silica powder has been confirmed to be non-crystalline by X-ray diffraction measurement device, were admixed with each other at a weight ratio of 9:1 for the Comparative Example 1 or a weight ratio of 8:2 for the Comparative Example 2, while the silicon nitride powder (C2) is admixed with the same silica powder at a weight ratio of 8:2 for the Comparative Example 3. A quartz crucible, which has been coated with the (C1) or (C2) previously heated to 40° C., was coated with 20% by weight aqueous slurry was prepared as described above by spraying followed by drying at 40° C. After drying, two release layers were baked onto the quartz crucible by using a batch type furnace and keeping it for 4 hours at 800° C. under atmospheric air condition. Thickness of each release layer was 190 to 220 μm as an average value of five point measurement.

Next, in the quartz crucible with baked release layer, 75 g of 2 to 5 mm Si granules having purity of 99.999% were filled. Using a box type electric furnace, it was maintained for 3 hours until 1000° C., 3 hours from 1000° C. to 1450° C., and 4 hours at 1450° C. under Ar flow of atmospheric pressure followed by cooling. After cooling, it was taken out of the furnace and observed for evaluating releasability. Further, Si melt permeation state in center bottom part of the crucible was observed with a naked eye. Further, after embedding the center bottom part of the crucible with an epoxy resin, a cross-section was cut out, and then a cross-sectional view of the release layer (×100 magnification) was obtained by using FE-SEM to observe and evaluate the Si melt permeation state. The results are described in the Table 1.

Comparative Examples 4 to 8

Next, the silicon diimide powder was subjected to thermal decomposition at 400 to 700° C. under flow of air-nitrogen mixture gas (oxygen concentration in the mixture gas: 0.001 to 2 vol %) in an amount of 70 liter/hr per kilogram of powder to obtain a non-crystalline silicon nitride powder for producing the silicon nitride powder (D). The resulting non-crystalline silicon nitride powder was pulverized by using a continuous vibration mill filled with metal balls coated with nylon, and then added to a crucible made of carbon, and the temperature was increased from room temperature to 1100° C. for 4 hours, from 1100° C. to 1250° C. at 10 to 50° C./hr, and from 1250° C. to 1550° C. for 4 hours. After keeping it at 1550° C. for 1 hr followed by cooling, the powder was taken out and subjected to brief pulverization for agglomerate by using a continuous vibration mill filled with metal balls coated with nylon or balls of sintered product of silicon nitride to obtain the silicon nitride powder (D) having an average particle diameter along the short axis of 0.66 to 12.9 μm and oxygen content of 0.20 to 2.1% by weight.

Specifically, as for the silicon nitride powder (D) of the Comparative Examples 4 and 5, the silicon nitride powder (A) which has an average particle diameter along the short axis of 12.9 μm and oxygen content of 0.37% by weight described in Examples 1 to 4 was used.

Subsequently, the silicon nitride powder (D) of the Comparative Example 6 was prepared as follows. First, the silicon diimide powder was subjected to thermal decomposition at a heating temperature adjusted to 700° C. in an oxygen concentration in the gas introduced for thermal decomposition adjusted to less than 0.001 vol % to produce a non-crystalline silicon nitride powder. The obtained non-crystalline silicon nitride powder was pulverized using a continuous vibration mill filled with metal balls coated with nylon to the extent that coarse agglomerate particles with particle diameter of 50 μm or more in terms of particle diameter according to the volumetric particle size distribution, which is measured by laser diffraction scattering method, are not contained. The pulverized non-crystalline silicon nitride powder was added to a crucible made of graphite, and the temperature was increased to 1100° C. for 4 hours, from 1100 to 1250° C. at 20° C./hr, and to 1550° C. for 4 hours. After keeping and calcining it at 1550° C. for 1 hr followed by cooling, the powder was taken out and subjected to brief pulverization by using a continuous vibration mill filled with metal balls coated with nylon to obtain silicon nitride powder (D) according to the Comparative Example 6, which has an average particle diameter along the short axis of 6.6 μm and oxygen content of 0.20% by weight.

As for the silicon nitride powder (D) of the Comparative Example 7, the silicon nitride powder (A) described in Examples 8 and 9 was used.

Subsequently, the silicon nitride powder (D) of the Comparative Example 8 was prepared as follows. First, the silicon diimide powder was subjected to thermal decomposition at a temperature adjusted to 700° C. in an oxygen concentration in the gas introduced for thermal decomposition adjusted to 4.5 vol % to produce a non-crystalline silicon nitride powder. The obtained non-crystalline silicon nitride powder was pulverized using a continuous vibration mill filled with metal balls coated with nylon to the extent that coarse agglomerate particles with particle diameter of 50 μm or more in terms of particle diameter according to the volumetric particle size distribution, which is measured by laser diffraction scattering method, are not contained. The pulverized non-crystalline silicon nitride powder was added to a crucible made of graphite, and the temperature was increased to 1100° C. for 4 hours, from 1100 to 1250° C. at 50° C./hr, to 1550° C. for 4 hours. After keeping and calcining it at 1550° C. for 1 hr followed by cooling, the powder was taken out and subjected to brief pulverization by using a continuous vibration mill filled with metal balls coated with nylon to obtain silicon nitride powder (D) according to the Comparative Example 8, which has an average particle diameter along the short axis of 0.66 μm and oxygen content of 2.1% by weight.

Next, the silicon diimide powder was subjected to thermal decomposition at 800 to 1100° C. under flow of air-nitrogen mixture gas (oxygen concentration in the mixture gas: 3.5 to 4.7 vol %) in an amount of 70 liter/hr per kilogram of powder to obtain a non-crystalline silicon nitride powder for producing the silicon nitride powder (E). The resulting non-crystalline silicon nitride powder was pulverized by using a continuous vibration mill filled with metal balls coated with nylon, and then added to a crucible made of carbon, and the temperature was increased from room temperature to 1100° C. for 4 hours, from 1100° C. to 1250° C. at 60 to 100° C./hr, and from 1250° C. to 1550° C. for 4 hours. After keeping it at 1550° C. for 1 hr followed by cooling, the powder was taken out and subjected to brief pulverization for agglomerate by using a continuous vibration mill filled with metal balls coated with nylon or balls of sintered product of silicon nitride to obtain, after oxidation calcination, the silicon nitride powder (E) having an average particle diameter along the short axis of 0.18 to 0.29 μm and oxygen content of 5.5 to 26.3% by weight.

Specifically, as for the silicon nitride powder (E) of the Comparative Example 4, the silicon nitride powder (B) which has an average particle diameter along the short axis of 0.29 μm and oxygen content of 7.6% by weight described in Examples 1 to 3 was used.

Subsequently, with regard to the silicon nitride powder (E) of the Comparative Example 5, after the brief pulverization, the silicon nitride powder (B) before oxidation calcination described in Examples 1 to 3 having an average particle diameter along the short axis of 0.29 μm was densely laid in a dish-shaped alumina container to a thickness of 10 mm or so, and then subjected to oxidation calcination by keeping it for 5 hours in a batch type electric furnace at 1200° C. under atmospheric air flow followed by cooling to obtain the silicon nitride powder (E), which has an average particle diameter along the short axis of 0.29 μm and oxygen content of 26.3% by weight. After keeping for 5 hours in a batch type electric furnace at 1200° C. under atmospheric air flow, the powder showed fused particles based on SEM image. However, when the SEM image (×10000 magnification) was enlarged by 400% to give a copy image, which was then used for measurement based on drawing a circle as described above, there was no change in the average particle diameter along the short axis.

As for the silicon nitride powder (E) of the Comparative Example 6, the silicon nitride powder (B) described in Example 6, which has an average particle diameter along the short axis of 0.18 μm and oxygen content of 10.3% by weight, was used.

Subsequently, with regard to the silicon nitride powder (E) of the Comparative Example 7 the silicon nitride powder (B) before oxidation calcination described in Example 6 having an average particle diameter along the short axis of 0.18 μm was densely laid in a dish-shaped alumina container to a thickness of 10 mm or so, and then subjected to oxidation calcination by keeping it for 4 hours in a batch type electric furnace at 1140° C. under atmospheric air flow followed by cooling to obtain the silicon nitride powder (E), which has an average particle diameter along the short axis of 0.18 μm and oxygen content of 15.2% by weight. After calcination by keeping for 4 hours in a batch type electric furnace at 1140° C. under atmospheric air flow, the powder exhibited slightly fused particles in a SEM image. However, when the SEM image (×10000 magnification) was enlarged by 400% to give a copy image, which was then used for measurement based on drawing a circle as described above, there was no change in the average particle diameter along the short axis.

As for the silicon nitride powder (E) of the Comparative Example 8, the silicon nitride powder (B) described in Example 8, which has an average particle diameter along the short axis of 0.18 μm and oxygen content of 5.5% by weight, was used.

10 g of mixed silicon nitride powder obtained by mixing the silicon nitride powder (D) and (E) at a weight ratio of 3:7 to 7:3, 40 g of distilled water, and 100 g of silicon nitride balls (10 mm in diameter) were packed in a 100 cc polyethylene bottle, fixed on a vibration mill with amplitude of 5 mm and frequency of 1780 spm, and shaken for 5 min to give a 20% by weight aqueous slurry. A quartz crucible (width×depth: 5 cm×4 cm) with porosity of 16%, which has been previously heated to 40° C., was coated with resulting 20% by weight aqueous slurry prepared as described above by spraying, followed by drying at 40° C. The quartz crucible after coating was again dried overnight at 40° C. After drying, the temperature was increased to a predetermined temperature of between 400 and 700° C. within 4 hours under atmospheric condition using a box type electric furnace. After keeping it for 4 hours at a predetermined temperature of between 400 and 700° C. followed by cooling, the release layer was baked onto the quartz crucible. Thickness of each release layer was 175 to 210 μm as an average value of five point measurement.

Next, in the quartz crucible with baked release layer, 75 g of 2 to 5 mm Si granules having purity of 99.999% were filled. Using a box type electric furnace, it was maintained for 3 hours until 1000° C., 3 hours from 1000° C. to 1450° C., and 4 hours at 1450° C. under Ar flow of atmospheric pressure followed by cooling. After cooling, it was taken out of the furnace and observed for evaluating release state. Further, Si melt permeation state in center bottom part of the crucible was observed with a naked eye. Further, after embedding the center bottom part of the crucible with an epoxy resin, a cross-section was cut out, and then a cross-sectional view of the release layer (×100 magnification) was obtained by using FE-SEM to observe and evaluate the Si melt permeation state. The results are described in the Table 1.

REFERENCE SIGNS LIST 1 casting mold
2 coarse silicon nitride particles
3 fine silicon nitride particles

What is claimed is:
1. A method for producing a polycrystalline silicon ingot casting mold having a release layer, comprising:
  forming a slurry by mixing a silicon nitride powder with water, the silicon nitride powder being obtained by blending a silicon nitride powder (A) having a short axis average particle diameter of 0.6 to 13 μm and an oxygen content of 0.3 to 1.0% by weight with a silicon nitride powder (B) having a short axis average particle diameter of 0.1 to 0.3 μm and an oxygen content of 1.3 to 20% by weight at a weight ratio of 5:5 to 9:1, coating a surface of the mold with the slurry, and heating the mold at 400 to 800° C. in an atmosphere containing oxygen, after coating the slurry.

2. The method according to claim 1, further comprising:

permeating moisture of the slurry coated on the surface of casting mold into the casting mold and the heating is performed after the moisture permeating.

3. A silicon nitride powder for mold release material for a polycrystalline silicon ingot casting mold, comprising a silicon nitride powder (A) having a short axis average particle diameter of 0.6 to 13 μm and an oxygen content of 0.3 to 1.0% by weight and a silicon nitride powder (B) having a short axis average particle diameter of 0.1 to 0.3 μm and an oxygen content of 1.3 to 20% by weight, which are contained at a weight ratio of 5:5 to 9:1.

4. A slurry containing a silicon nitride powder for mold release material for a polycrystalline silicon ingot casting mold, comprising the silicon nitride powder according to claim 3 mixed with water.

5. A polycrystalline silicon ingot casting mold having a release layer formed on an inner surface of the casting mold by utilizing the silicon nitride powder according to claim 3.

* * * * *